United States Patent [19]

Foss

[11] Patent Number: 4,789,796

[45] Date of Patent: Dec. 6, 1988

[54] OUTPUT BUFFER HAVING SEQUENTIALLY-SWITCHED OUTPUT

[75] Inventor: Richard C. Foss, Ontario, Canada

[73] Assignee: U.S. Philips Corporation, New York, N.Y.

[21] Appl. No.: 939,339

[22] Filed: Dec. 8, 1986

[30] Foreign Application Priority Data

Dec. 23, 1985 [GB] United Kingdom ............... 8531622

[51] Int. Cl.$^4$ .................... H03K 17/04; H03K 17/12; H03K 17/284; H03K 17/687

[52] U.S. Cl. ..................... 307/443; 307/246; 307/270; 307/296 R; 307/548

[58] Field of Search ................... 307/600–603, 307/605, 606, 590, 571, 576, 579, 585, 270, 451, 443, 242, 296 R, 246, 548

[56] References Cited

U.S. PATENT DOCUMENTS

| | | | |
|---|---|---|---|
| 3,248,657 | 4/1966 | Turecki | 307/602 X |
| 3,654,491 | 4/1972 | Earp | 307/606 X |
| 3,911,289 | 10/1975 | Takemoto | 307/451 |
| 4,359,654 | 11/1982 | Buckendorf et al. | 307/571 |
| 4,472,643 | 9/1984 | Furuyama | 307/605 X |
| 4,487,457 | 12/1984 | Janutka | 307/242 |
| 4,567,379 | 1/1986 | Corey et al. | 307/270 |
| 4,682,047 | 7/1987 | von Sichart | 307/585 X |

FOREIGN PATENT DOCUMENTS

| | | | |
|---|---|---|---|
| 3329093 | 2/1985 | Fed. Rep. of Germany | 307/571 |
| 0104831 | 6/1984 | Japan | 307/571 |
| 2119193 | 11/1983 | United Kingdom | 307/451 |

OTHER PUBLICATIONS

"CMOS Inverter Optimization", IBM Tech. Discl. Bull., vol. 28, No. 2, pp. 790–791, Jul. 1985.

Primary Examiner—Stanley D. Miller
Assistant Examiner—David R. Bertelson
Attorney, Agent, or Firm—Steven R. Biren

[57] ABSTRACT

An integrated semiconductor circuit includes an output stage and a control circuit. The output stage comprises several (e.g. four) pull-down output transistors, which are sequentially switched on for pulling down the output node, whereby four small current steps are made instead of one high current step. As a result the package inductance generated power supply line noise will be substantially reduced (by at least a factor four). The same technique can be used for limiting the supply line noise due to the charge current for charging the output node via pull-up transistors.

14 Claims, 6 Drawing Sheets

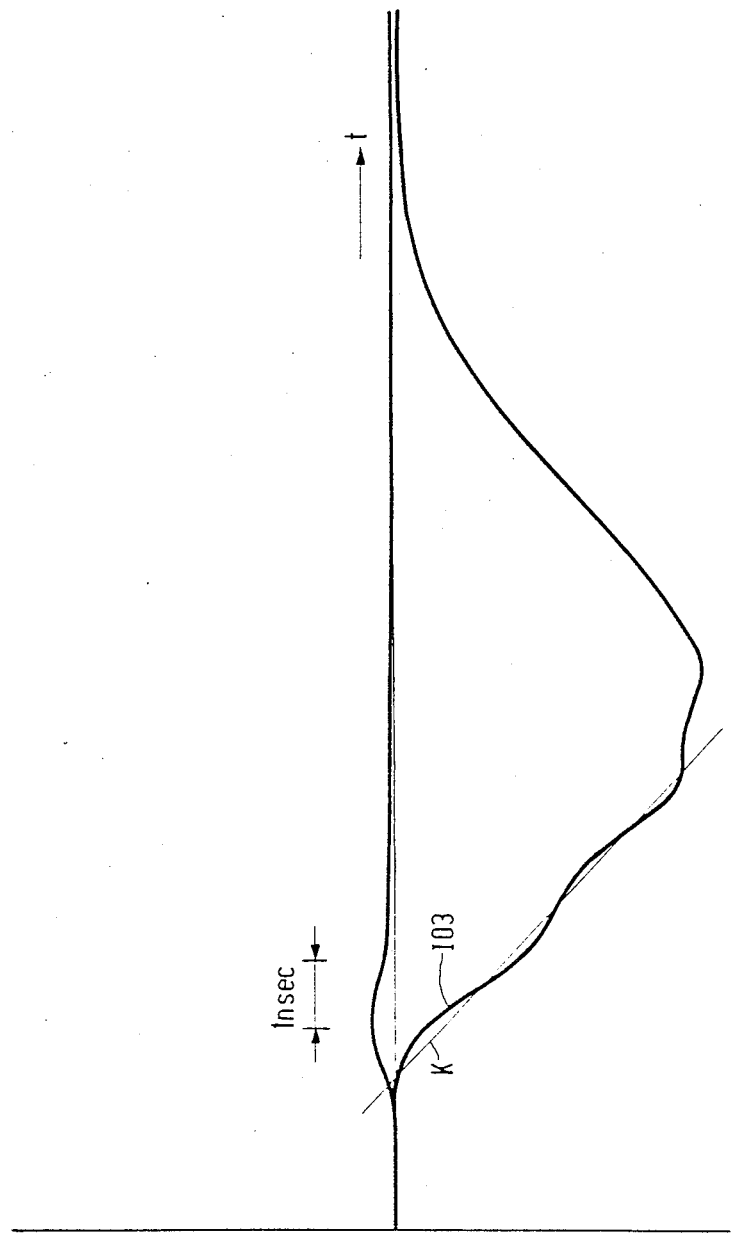

OUTPUT BUFFER HAVING SEQUENTIALLY-SWITCHED OUTPUT

BACKGROUND OF THE INVENTION

The invention is related to an integrated semiconductor circuit comprising a control circuit, an output stage, an input and an output, the output stage comprising pull-up means connected between a first supply terminal and the output and pull-down means connected between a second supply terminal and the output, said control circuit controlling at least one of said pull-up or pull-down means for limiting the time rate of change of current at the output upon receipt of an input signal change at the input.

Such a circuit is known from a publication in I.B.M. Technical Disclosure Bulletin, Vol. 27, No. 1A June 1984, pages 13–14. In said publication the problem of package inductance generated power supply line noise (voltage bumps) has been discussed. The supply line noise will be generated when large fast current spikes occur in said supply lines. In VLSI circuits e.g. byte wide static random access memories this problem is very troublesome, in particular if eight output loads of 100 pF have to be driven from 0 Volts to +5 Volts or vice versa. It is easily to understand that a fast charge or discharge of said loads will cause a large current peak in the power supply lines thus generating noise. Large pull-up or pull-down output transistors will respectively charge or discharge the loads very fast, which is an advantage, but then so much ground noise will be generated that e.g. a false retriggering of an address input transition detector will occur.

In the above-mentioned publication a control circuit is provided for controlling the push-pull output stage of the so-called off-chip driver, in which the time rate of change of current is limited. However the shown circuit does not function satisfactorily. As described in the publication the control circuit has an output node, which is connected to the gate of a pull-down transistor and which is charged at a slow rate in the beginning and then charged at a fast rate. Due to the characteristics of the pull-down Field Effect Transistor and to spread of parameters in production process the circuit does not perform as it has been designed.

SUMMARY OF THE INVENTION

It is the object of the invention to provide an integrated semiconductor circuit comprising a control circuit and an output stage, in which an approximation to a constant time rate of change of current at the output is achieved.

An integrated semiconductor circuit in accordance with the invention is characterized in that at least one of said pull-up or pull-down means comprises two or more semiconductor devices each having a control electrode and a first and second main electrode, the semiconductor devices being connected in parallel except for the gate electrodes, which receive control signals from the control circuit for sequentially turning said semiconductor devices on or off upon a change of the input signal. In the integrated semiconductor circuit in accordance with the invention the approximation to a constant time rate of change of current in the output stage is achieved by successively turning on the semiconductor devices. As a result the maximum amplitude of the output current is reached in steps, thus reducing the rate of change of the current, which therefore can be kept within desired limits.

An embodiment of the invention is characterized in that the control circuit comprises delay means for delaying a further control signal for a further semiconductor device with respect to a first control signal for a first semiconductor device.

A preferred embodiment of the invention is characterized in that the delay means comprises a first and two further inverters, of which the first inverter has an input for receiving the first control signal and an output for generating an intermediate control signal, which has a slow rising or falling slope with respect to a falling or rising slope of the first control signal respectively, the further inverters each having an input for receiving the intermediate control signal and an output for generating further control signals for the semiconductor devices, said further inverters each having a different transition voltage.

It should be noted that the above invention can be used in bipolar, NMOS, PMOS, CMOS and in GaAs integrated semiconductor circuits.

BRIEF DESCRIPTION OF THE DRAWING

The invention will be further explained by the way of examples of embodiments of CMOS circuits with reference to the accompanying drawing, in which:

FIGS. 5, 6 and 7 show time diagrams of several signals occurring in the circuits as shown in FIGS. 4 and 5.

DESCRIPTION OF THE PREFERRED EMBODIMENTS

Figure 1:
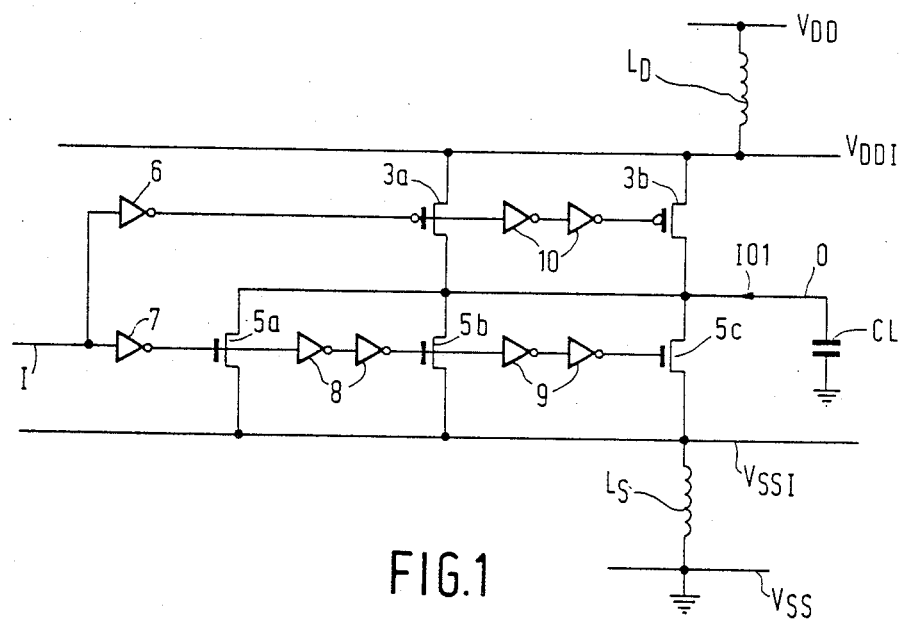
FIG. 1 shows a logic diagram of an embodiment of a circuit in accordance to the invention.

In FIG. 1 a simple embodiment of an integrated semiconductor circuit 1 in accordance with the invention has been shown. The circuit 1 has an output stage comprising a pull-up semiconductor device 3a, which is a PMOS transistor, and severall pull-down semiconductor devices 5a, 5b and 5c, which are NMOS transistors. The device 3a has been connected between an internal first power supply node $V_{DDI}$ and an output node O. The devices 5a, b and c have been connected between the output node O and an internal second power supply node $V_{SSI}$.

It is well known that the internal power supply nodes $V_{DDI}$ and $V_{SSI}$, which are situated on a semiconductor chip, are connected to external connection pins $V_{DD}$ and $V_{SS}$ via leads $L_D$ and $L_S$. Although such leads $L_D$ and $L_S$ are as short as possible they still constitute inductive loads which generate undesired voltage peaks (called "bumps") if currents through the leads $L_D$ or $L_S$ suddenly change substantially in amplitude due to a change of a data input signal on input I. Of course the power supply lines, which are connected to the nodes $V_{DDI}$ and $V_{SSI}$, on the semiconductor chip itself are also inductive, but this inductivity is much less than the inductivity of the leads $L_D$ and $L_S$ and may be considered as being a part of $L_D$ and $L_S$ in this invention.

A data signal is supplied to an input node I and via a control circuit, comprising at least input inverters 6 and 7, to device 3a and 5a. The input inverters 6 and 7 may have different transition voltages in order to switch device 3a off before device 5a is turned on or to turn device 5a off before device 3a is turned on. The output of inverter 7 has been connected to an input of two inverters 8 connected in series, of which the output controls device 5b and is connected to the input of two inverters 9 in series. The output of inverters 9 control the pull-down device 5c. The inverters 8 and 9 are part of the controls circuit for controlling the output stage.

The circuit 1 functions as follows. An input signal on input node I has a high level so that device 3a is conductive. A capacitive load CL, which exists at output node O, will be charged. If the input signal on input node I changes from high to low, then device 3a will be made non-conductive first (due to the different (higher) transition voltage of inverter 6 with respect to the transition voltage of inverter 7), whereafter device 5a will be made conductive and due to the delays, which are caused by the inverters 8 and 9, devices 5b and then 5c will be each turned on in succesion.

Figure 2:
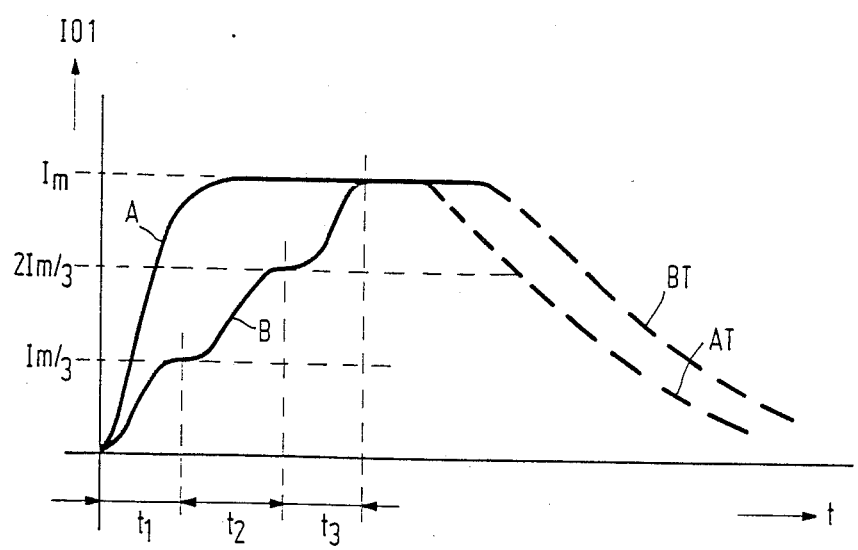
FIG. 2 shows a current time diagram of the output current of the circuit of FIG. 1.

When turned on, each of the three transistors 5a, b and c constitute a conductive path between output O and the terminal $V_{SS}$ via the inductive lead LS. Each of the transistors 5a, b and c may have a conductivity, which is one third of the conductivity of a single large transistor (not shown) which would discharge the capacitive load CL with the same maximum current, thus discharging at approximately the same rate said load CL. If however such a large transistor is switched on a discharge current through lead $L_S$ would grow from a (very) low value to a maximum value (determined by the geometry of said large transistor and the voltage on load CL) at a high time rate. This has schematically been by a curve A shown in FIG. 2, in which the amplitude of the discharge current I01 has been shown as a function of time. Curve A rises sharply at a high rate to a maximum value $I_m$. Thus the voltage bump generated at internal node $V_{SSI}$ will be substantial and proportional to $I_m$ and to (dIo)/dt. If in accordance with the invention first transistor 5a will be switched on, the output current I01 will rise less sharply (as the conductivity of 5a is one third of said large transistor) the time rate of curve B at the time t=0 is one third of the time rate of curve A. Further the maximum amplitude of the current through transistor 5a is one third of the maximum amplitude $I_m$. Thus the voltage bump generated by the current change due to switching on transistor 5a is reduced to a measure somewhere between one third and one ninth (best case) of the voltage bump due to switching on the large transistor mentioned hereinbefore.

After a time delay $t_1$ due to the delay by of the control signal (by the inverters 8), transistor 5b turns on and causes a next change of current Io. As the capacitive load CL has hardly been discharged during the small delay period $t_1$ the time rate of change and the total amount of change of the current I01 during the delay period $t_2$ is approximately similar to the time rate of change and the amount change of the current I01 during the delay period $t_1$. It is of advantage if the current through transistor 5a has nearly reached its maximum value $I_m/3$. If so the voltage bump due to switching on transistor 5a will substantially be faded away at the switch-on moment of transistor 5b. Superposition of the voltage bumps due to switching on transistor 5a and successively transistor 5b will thus hardly differ from the voltage bump due to the current change through transistor 5b alone.

The same holds for switching on transistor 5c after a delay period $t_2$. Again a current change with the same time rate and the same amplitude will occur. So after a time lapse of approximately $(t_1+t_2+t_3)$ a maximum current value $I_m$ has been reached and may stay at that level for some time until the capacitive load CL has been discharged to a certain level. After said time the current I01 will decrease more or less exponentially. The exponential curve will be determined by a negative time constant, which is inversely proportional to the value of the capacitive load CL and to the resistivity of the three conductive transistors 5a, b and c in parallel. The current I01 indicated by curve A will decrease along line AT and the current I01 following curve B will decrease along line BT as schematically indicated. As can be seen and understood the gradually switched on discharge path of load CL does not substantially delay the discharge of said load CL with respect to a large transistor, which suddenly starts all discharging the load CL.

Of course the same reasoning can be held for transistor 3a in the case that the load CL has to be charged. However in the shown circuit 1 the following effect occurs as soon as load CL is charged and if the load CL is not too large. The charge accumulating in CL causes a rising potential on output node O. As a result the gate source voltage of transistor 3a will rise accordingly and thus will counteract the time rate of change of the current through the transistor 3a and thus through the inductive lead $L_D$. However the load CL is often so large that the potential on output O rises too slowly to cause a sufficient counteract and thus the voltage bump generated on node $V_{DDI}$ is not kept within safe limits. If this situation is present the output of inverter 6 is to be connected to the input of two serially-connected inverters 10, of which the output controls a further pull-up transistor 3b for gradually switching on in cooperation with transistor 31 a load current for capacitive load CL. Of course transistors 3a and 3b should be smaller than a single transistor necessary for charging the load CL in the same time.

Figure 3:
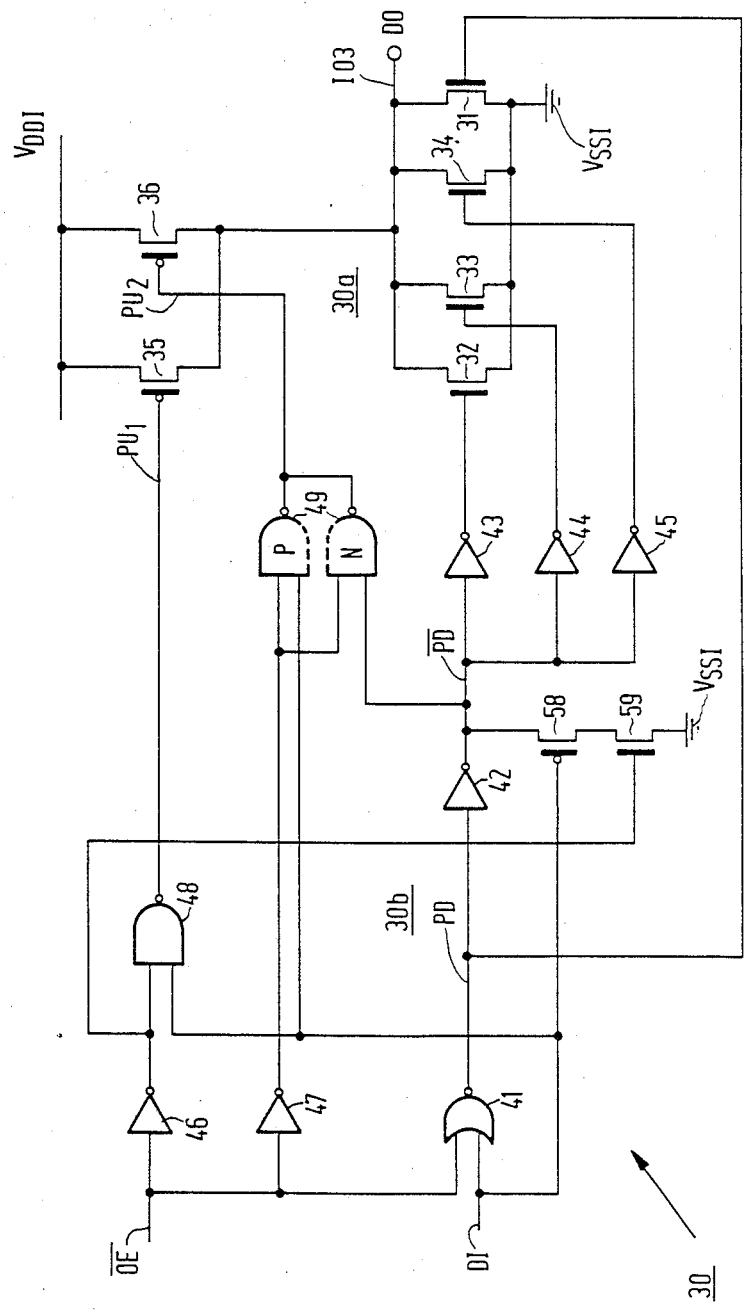
FIG. 3 shows a further diagram of a preferred embodiment of a circuit in accordance with the invention.

In FIG. 3 a logic diagram of a preferred embodiment of a circuit 30 comprising an output stage 30a and a control circuit 30b in accordance with the invention is shown. The CMOS transistor output stage 30a comprises four pull-down devices 31, 32, 33, 34 (NMOS transistors) and two pull-up devices 35, 36 (PMOS transistors), which are connected between an internal power supply node $V_{SSI}$ and the output node DO respectively between the internal power supply node $V_{DDI}$ and the output node DO. A first pull-down device 31 is controlled by a first control signal PD, which is generated at the output of a NOR gate 41 of the control circuit 30b. The NOR gate 41 has two inputs, which are connected to a data input node DI and an enable input node $\overline{OE}$. If the data input DI and the enable input $\overline{OE}$ both go low the first signal PD will rapidly increase. A first inverter 42 will generate an intermediate control signal e,ovs/PD/ on its output. The output is provided with a discharge path, which is constituted by two transistors 58 and 59. The control and function of the transistors 58 and 59 will be explained below. This control signal $\overline{PD}$ has a slow falling slope with respect to the rising slope of the first control signal PD as will also be explained below. The slow falling control signal $\overline{PD}$ is supplied to inputs of three further inverters 43, 44, 45, which each have a different transition level. As a result transistor 31 is switched on immediately upon reaching the logic "true" state of signal PD and the transistors 32, 33 and 34 are switched on successively, whereby the time delay between the switch-on moments depends on the steepness of the slope of the falling control signal $\overline{PD}$ and the difference in transition level of the inverters 43, 44 and 45 (e.g. the slope of $\overline{PD}$ is 1 V/3 nsec. and the transition level difference is 0.5 Volt then the time delay will be 1.5 nsec).

The enable input $\overline{OE}$ has also been connected to inputs of the inverters 46 and 47. The output of inverter 46 is connected to an input of a first NAND gate 48, of which an output controls the first pull-up device 35 and of which a further input is connected to the data input DI. The inverter 46 is called the "fast" inverter, but it is a common CMOS circuit and shows only common (typical) signal delay. On the contrary, the inverter 47 is called a "slow" inverter as its output is loaded with a small capacitor, thus the output signal of the inverter 47 will show longer rise and fall times with respect to the input enable signal $\overline{OE}$. A NAND gate 49 receives on its inputs the output signal of the slow inverter 49, the signal on the data input DI and the intermediate control signal $\overline{PD}$. The output of NAND gate 49 controls the second pull-up device 36.

The NOR gate 41, the further inverters 43, 44 and 45, the "fast" inverter 46 and the NAND gate 48 are standard CMOS circuits and need no further explanation (as already has been described the inverters 43, 44 and 45 each have a different transition level, such inverters are known per se from U.S. Pat. No. 3,631,528). It is to be noted that the NAND gate 49 is not functioning as a conventional NAND gate, but its operation will be elucidated hereinafter.

Figure 4:
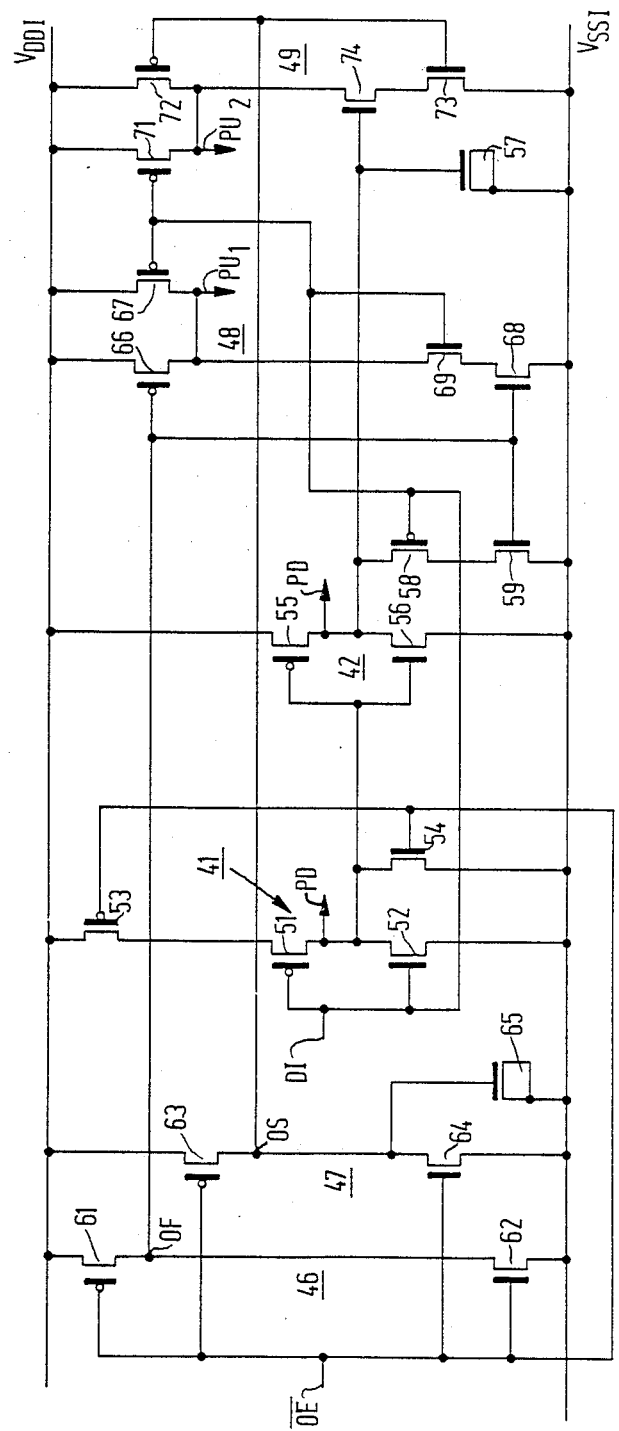
FIG. 4 shows a part of the control circuit of FIG. 3.

The control circuit 30b of FIG. 3 has partly in detail been shown in FIG. 4 (the inverters 43, 44, 45 have not been shown). The data input DI is connected to the gates of transistors 51 (PMOS) and 53 (NMOS), which are part of the NOR gate 41. The gate 41 comprises further a PMOS transistor 53 and a NMOS transistor 54, of which the gate electrodes are connected to the enable input $\overline{OE}$. The output of NOR gate 41 provides the first control signal PD, which is supplied to the gate of pull-down device (NMOS transistor) 31 (FIG. 3) and to the first inverter 42. The inverter 42 comprises a PMOS transistor 55 and a NMOS transistor 56, of which the NMOS transistor has a small length and a large channel width (e.g. W/L=2/8). The output of inverter 42 generates the intermediate signal $\overline{PD}$ and is loaded with a capacitor 57 which is a NMOS transistor (e.g. W/L=30/5) which has its main electrodes connected to $V_{SSI}$. Transistors 58 (PMOS) and 59 (NMOS) constitute a discharge path between the output $\overline{PD}$ and the internal supply node $V_{SSI}$ in the case when the transistors 58 and 59 are made conductive by, respectively, the signal on the data input DI and the signal at the output of inverter 46. This inverter 46 comprises a PMOS transistor 61 and NMOS transistor 62, which receive on the gate electrodes the signals on enable input $\overline{OE}$.

The inverter 47 comprises a PMOS transistor 63 and a NMOS transistor 64, and its output is loaded with a capacitor 65. The capacitor 65 is constituted by a NMOS transistor (W/L=5/20), of which the main electrodes are connected to the internal supply node $V_{SSI}$. The signals on the output of inverter 46 control a PMOS transistor 66 and a NMOS transistor 68 of the NAND gate 48, of which a PMOS transistor 67 and a NMOS transistor 69 are controlled by the signal on the data input DI. The signal on the data input DI further controls a PMOS transistor of the NAND gate 49, of which a further PMOS transistor 72 and a NMOS transistor 73 are controlled by the output of the slow inverter 47. Transistors 71 and 74 are connected in parallel, whereby the transistor 73 is connected in series with a NMOS transistor 74, which is controlled by the signal $\overline{PD}$ at the output of inverter 42. The outputs PU1 and PU2 of NAND gate 48 and NAND gate 49 control the pull-up transistor 35 (FIG. 3) and pull-up transistor 36 (FIG. 3), respectively.

The circuits 30a and 30b, which have been shown in FIG. 3 and FIG. 4, function as follows. If the signal on the enable input $\overline{OE}$ is low ($\overline{OE}$=true) and the signal on the data input DI is high (true) then the output of NOR gate 41 will be low (PD=false) and the output of inverter 42 will be high ($\overline{PD}$=true) as a result all pull-down transistors 31 to 34 will not be conductive (are switched off). The inputs of NAND gate 48 both are low, thus its output provides a high signal PU1 and thus transistor 35 is switched off. The signal PU2 is also high, because both PMOS transistors 71 and 72 and NMOS transistor 73 of NAND gate 49 receive a low signal. The output O of circuit 30 thus is in high impedance state. If the signal on the data input DI changes from low to high the outputs of the NOR gate 41, and of the NAND gates 48 and 49 will not change. The high impedance state of the output O is maintained as long as the signal on the enable input $\overline{OE}$ is high.

Figure 5:
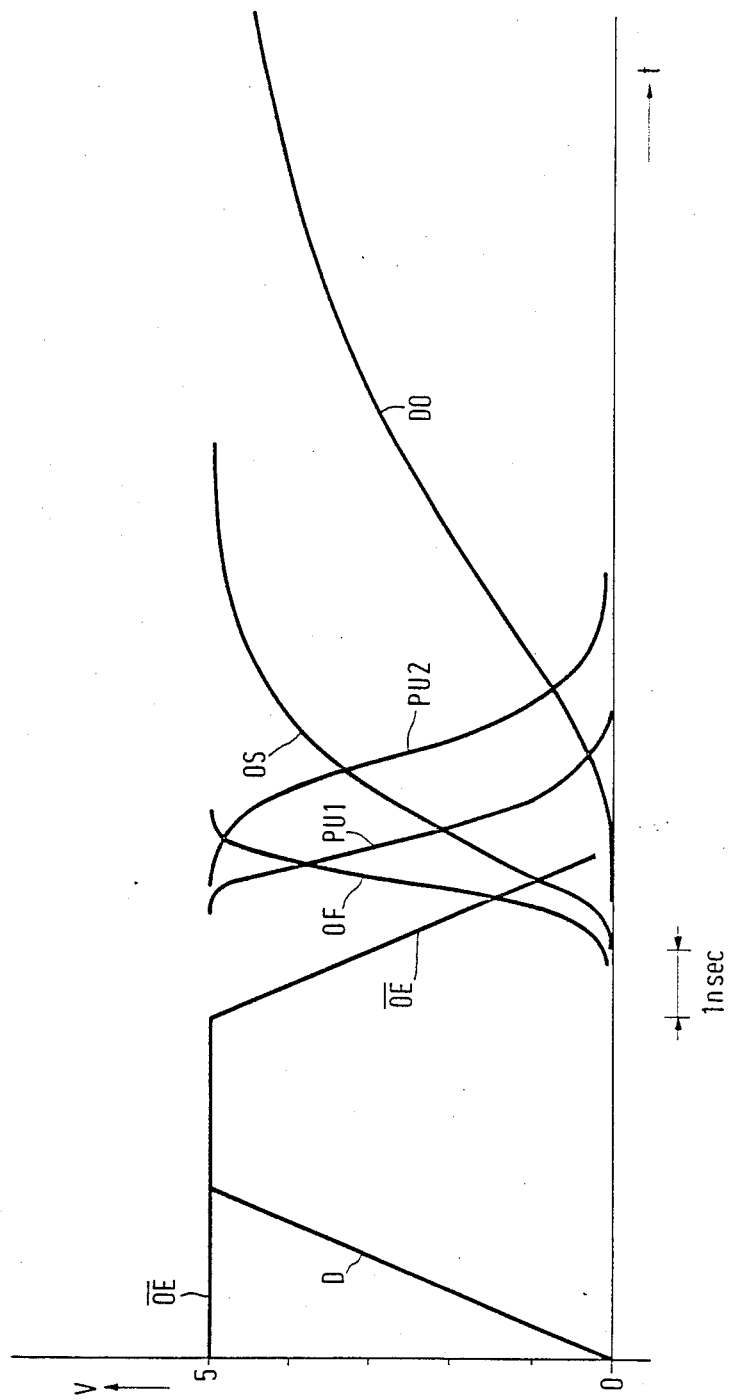

If the data input DI is high and the enable input $\overline{OE}$ goes low then first the NAND gate 48 receives two "high" signals on its inputs (DI=high, fast inverter 46 provides a "high" signal). As a result transistor 35 will conduct and thus will start to pull-up the signal level on output O. The PMOS transistor 71 of NAND gate 49 receives a high signal and is switched off. The NMOS transistor 74 receives the intermediate control signal $\overline{PD}$, which is high and thus transistor 74 will be in a conductive state. The transistors 72 and 73 are controlled by the output of the slow inverter 47, which is loaded with a capacitor 65 and thus the output voltage of said inverter 47 will rise slowly with respect to the output voltage on the output of inverter 46. So after some delay the voltage on the gates of transistors 72 and 73 has increased to such a level that transistors 72 and 73 will respectively be switched off and be switched on. As a result signal PU2 will go low and will make transistor 36 conductive in order to pull-up the signal level on output DO faster. In FIG. 5 several amplitude time plots have been shown of signals occurring in circuit 30 (FIG. 3). The input signal D on input DI is shown which goes high (no change of other signals) and is kept high. Signal $\overline{OE}$ goes low. Signal OF (output-fast inverter 46) goes high. Signal OS (output-slow inverter) goes "slowly" high after some delay. Signal PU1 will drop first and after a delay of ±1.5 nsec the signal PU2 will drop. The output signal DO will first rise slowly and than faster.

Figure 6:
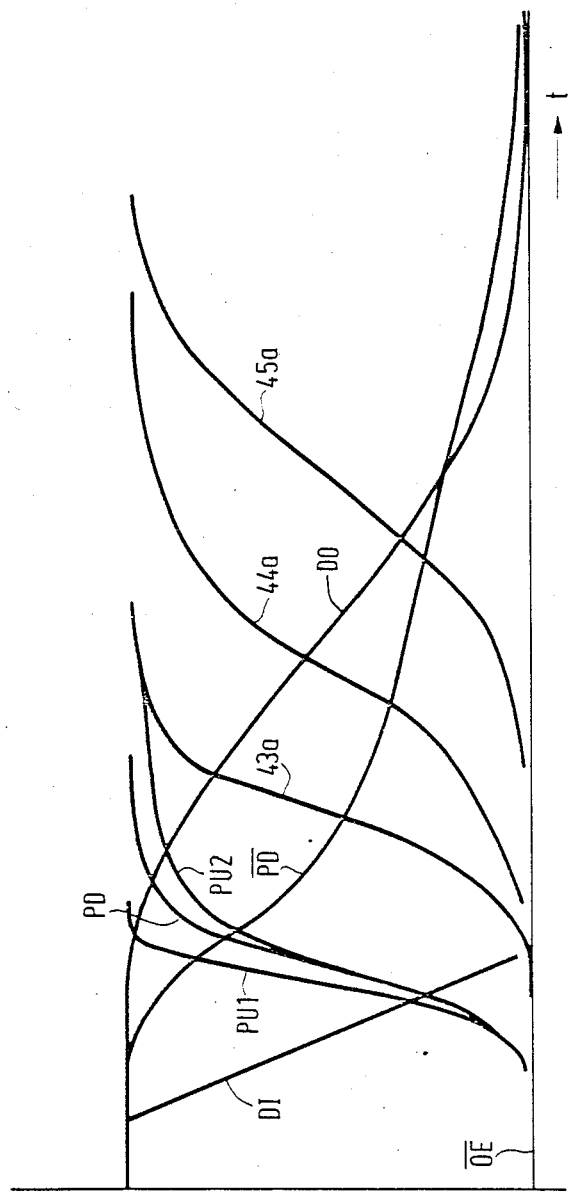

If thereafter the data input DI goes from high to low and the enable input $\overline{OE}$ is low (true) then the circuit 30 behaves as is shown in FIG. 6. First the output signal PU1 of NAND 48 will go high, which switches off transistor 35. The output PD of NOR gate 41 will go high and with short delay the output signal PU2 of NAND gate 49 will go high, because transistor 71 will start to conduct. However transistor 73 is still conductive and the signal PU2 will not go high as fast as signal PU1 because transistor 74 of NAND gate 49 is controlled by the output $\overline{PD}$ of inverter 42. This output will go low slowly due to the discharge path of transistors 58 and 59, which determine the discharge rate of capacitor 57 and which already starts to discharge upon receipt of signal DI. As can be seen in FIG. 6 the output PD rises first, the output $\overline{PD}$ will start to drop and coinciding therewith the output signal PU2 of NAND gate 49 will start to rise. So with a short delay with respect to transistor 35 the second pull-up transistor 36 will be switched off. As soon as signal PD goes high, transistor 31 is made conductive and starts to discharge output node O. In FIG. 6 the output voltage DO on the output node O has been shown and the voltage DO will decrease slowly as long as transistor 31 is conductive. The output $\overline{PD}$ of inverter 42 will be discharged slowly via transistors 58 and 59. As a result the transistors 32, 33 and 34 will be switched on in sequence due to the different transition voltages of the inverters 43, 44 and 45. In FIG. 6 the output voltages 43a, 44a and 45a of inverters 43, 44 and 45 have been shown. The time base in FIG. 6 shows time lapses of 1 nsec. So if the threshold voltages of the transistors 31, 32, 33 and 34 is |1| V then the delay between the successive switch on moments of the pull-down transistors 31, 32, 33 and 34 is respectively 2 nsec, 1,5 nsec and 2,5 nsec.

In FIG. 7 a current time diagram shows the current (mainly the current I03 (FIG. 3)) of the circuit 30 in the situation that the enable input $\overline{OE}$ is low and the data input DI goes low (FIG. 6 shows the corresponding voltage diagrams on the same time base). Just after the instant 2 nsec. transistors 31 starts to conduct, after the instants 4 nsec., 5,5 nsec. and 8 nsec. respectively the transistors 32, 33 and 34 will start to conduct. As can be seen from the Figure the time rate of change of the current fluctuates around the value 16 mA/nsec., which is indicated by a drawn line K. As a result the voltage swings or bumps induced in the power supply leads will be kept in specific limits, which can be selected.

What is claimed is:

1. An integrated semiconductor circuit comprising a control circuit, an output stage, an input and an output, the output stage comprising pull-up means connected between a first supply terminal and the output and pull-down means connected between a second supply terminal and the output, said control circuit controlling at least one of said pull-up and pull-down means for limiting the time rate of change of current at the output upon receiving an input signal change at the input, at least one of said pull-up and pull-down means comprising at least two semiconductor devices each having a control electrode and first and second main electrodes, the semiconductor devices being connected in parallel except for their control electrodes, said control electrodes receiving control signals from the control circuit for sequentially changing the state of said semiconductor devices upon receiving a change of the input signal.

2. An integrated semiconductor circuit as claimed in claim 1, characterized in that the control circuit comprises delay means for generating a delayed control signal, and a further semiconductor device for receiving said delayed control signal.

3. An integrated semiconductor circuit as claimed in claim 2, characterized in that the delay means comprises first and second inverters in series.

4. An integrated semiconductor circuit as claimed in claim 1, 2 or 3, characterized in that the number of devices of the pull-up means is smaller than the number of devices of the pull-down means.

5. An integrated semiconductor circuit as claimed in claim 3, characterized in that the delay means further comprises at least third and fourth inverters, and said first inverter has an input for receiving the first control signal and an output for generating an intermediate control signal, which has a slow rising or falling slope with respect to a falling or rising slope of the first control signal, the third and fourth inverters each having an input for receiving the intermediate control signal and an output for generating further control signals for the semiconductor devices, said third and fourth inverters each having a different transition voltage.

6. An integrated semiconductor circuit as claimed in claim 5, characterized in that the output of the first inverter is provided with a capacitive load.

7. An integrated semiconductor circuit as claimed in claim 1, 2 or 3, comprising a NOR gate and characterized in that the control circuit has a data input and an enable input, which each are connected to inputs of said NOR gate, at the output of which a first control signal is generated, the enable input receiving an inverted output enable signal.

8. An integrated semiconductor circuit as claimed in claim 7, comprising a NAND gate, a fast inverter and a first pull-up device, characterized in that the data input is connected to a first input of said NAND gate and the enable input is connected to a second input of the NAND gate via said first inverter, the output of the NAND gate being connected to the gate electrode of said first pull-up device.

9. An integrated semiconductor circuit as claimed in claim 8, comprising a slow inverter, a second NAND gate and a second pull-up device, characterized in that the enable input is connected via said slow inverter to a first input of said second NAND gate, a second input of the second NAND gate being connected to the data input and a third input of the second NAND gate being connected to the output of the first inverter for receiving the intermediate control signal, and an output of the second NAND gate being connected to the gate electrode of said second pull-up device.

10. An integrated semiconductor circuit as claimed in claim 7, characterized in that a discharge path is provided between the output of the first inverter and the second supply terminal, which discharge path comprises two discharge devices in series, the discharge devices being controlled by signals on the data input and on the enable input.

11. An integrated semiconductor circuit as claimed in claim 8, characterized in that the pull-up devices are PMOS transistors, the pull-down devices are NMOS transistors, all inverters comprise a PMOS and a NMOS transistor and the NOR and the first NAND gate are CMOS gates.

12. An integrated semiconductor circuit as claimed in claim 11, comprising two serially-connected NMOS transistors, characterized in that the second NAND gate comprises two PMOS transistors in parallel, connected in series with said two serially-connected NMOS transistors, of which a first and a second of said two PMOS transistors have their gate electrodes connected to the output of the slow inverter and to the data input, respectively, and of which the first and second of said two NMOS transistor have their gate electrodes connected to the output of the first inverter and to the output of the slow inverter, respectively.

13. An integrated semiconductor circuit as claimed in claim 11, characterized in that the discharge device controlled by signals on the data input in a PMOS transistor and the discharge device controlled by signals on the enable input is an NMOS transistor, the gate electrode of which is connected to the output of the fast inverter.

14. An integrated semiconductor circuit as claimed in claim 11, characterized in that the capacitive load is a MOS transistor of which the gate electrode is connected to the output of the first inverter and the main electrodes are connected to one of the supply terminals.

* * * * *